(12) United States Patent
Raghavan et al.

(10) Patent No.: US 9,626,471 B2
(45) Date of Patent: Apr. 18, 2017

(54) METHODS AND SYSTEMS FOR FILTERING COMPONENTS IN HIERARCHICALLY-REFERENCED DATA

(71) Applicants: Mahesh Raghavan, Denville, NJ (US); Lawrence Steven Bach, Chester, NH (US); Dana Rigg, Austin, TX (US); Peter Elliott Haynes, Costa Mesa, CA (US)

(72) Inventors: Mahesh Raghavan, Denville, NJ (US); Lawrence Steven Bach, Chester, NH (US); Dana Rigg, Austin, TX (US); Peter Elliott Haynes, Costa Mesa, CA (US)

(73) Assignee: Dassault Systemes Americas Corp., Waltham, MA (US)

( * ) Notice: Subject to any disclaimer, the term of this patent is extended or adjusted under 35 U.S.C. 154(b) by 86 days.

(21) Appl. No.: 14/572,367

(22) Filed: Dec. 16, 2014

(65) Prior Publication Data
US 2015/0242556 A1 Aug. 27, 2015

Related U.S. Application Data

(60) Provisional application No. 61/942,915, filed on Feb. 21, 2014.

(51) Int. Cl.
*G06F 17/50* (2006.01)
(52) U.S. Cl.
CPC .......... *G06F 17/5068* (2013.01); *G06F 17/50* (2013.01)
(58) Field of Classification Search
CPC .......... G06F 11/1451; G06F 17/30598; G06F 3/0482; G06F 17/3028; G06F 3/0484; G06F 3/04847; G06K 9/00147

USPC ......................................... 716/106, 107, 111
See application file for complete search history.

(56) References Cited

U.S. PATENT DOCUMENTS

| | | | |
|---|---|---|---|
| 6,192,506 B1 * | 2/2001 | Vishnubhatla | G05B 19/05 700/18 |
| 6,480,857 B1 | 11/2002 | Chandler | |
| 7,363,599 B1 | 4/2008 | Vogenthaler | |
| 8,510,685 B1 | 8/2013 | Rossman et al. | |
| 2003/0135491 A1 * | 7/2003 | Rowley | G06F 17/30327 |
| 2008/0215545 A1 * | 9/2008 | Liu | G06F 17/30126 |

(Continued)

OTHER PUBLICATIONS

Gross, Hans-Gerhard et al.; Towards Software Component Procurement Automation with Latent Semantic Analysis; Electronic Notes in Theoretical Computer Science; vol. 189; 2007; pp. 51-68.

(Continued)

*Primary Examiner* — Nghia Doan
(74) *Attorney, Agent, or Firm* — Armstrong Teasdale LLP

(57) ABSTRACT

A computer-implemented method for filtering components from a logical component hierarchy is provided. The method uses a computing device having a processor and a memory. The method includes identifying, in the memory, a filter associated with the logical component hierarchy. The method also includes comparing, by the processor, a sub-component of the logical component hierarchy with the filter. The method further includes identifying the sub-component for filtration based on the comparison of the sub-component with the filter. The method also includes filtering the sub-component from the logical component hierarchy.

20 Claims, 9 Drawing Sheets

(56) References Cited

U.S. PATENT DOCUMENTS

| | | |
|---|---|---|
| 2009/0158225 A1 | 6/2009 | Basappa et al. |
| 2009/0193051 A1 | 7/2009 | Ueda et al. |
| 2013/0144833 A1* | 6/2013 | Ivanova ............ G06F 17/30592 |
| | | 707/600 |
| 2014/0046712 A1 | 2/2014 | Symmonds |
| 2014/0214783 A1 | 7/2014 | Stichling et al. |

OTHER PUBLICATIONS

EP Extended Search Report for related application 15000428.1 dated Jun. 23, 2015; 7 pp.

* cited by examiner

ME THODS AND SYSTEMS FOR FILTERING COMPONENTS IN HIERARCHICALLY-REFERENCED DATA

CROSS-REFERENCE TO RELATED APPLICATION

This application claims the benefit of U.S. Provisional Patent Application No. 61/942,915 filed on Feb. 21, 2014, which is hereby incorporated by reference herein in its entirety.

BACKGROUND OF THE DISCLOSURE

This disclosure relates generally to managing hierarchies of components in a product design environment and, more particularly, to filtering components out of a component hierarchy.

When designing and developing large integrated systems, circuits in particular, typically no one team of engineers is responsible for the entire design of the system. Instead, often teams of engineers are responsible for designs of components of the system, the overall design being the totality of the designs of the components provided by each team of engineers. As the system becomes more complex, more and more aspects of the system are divided into sub-components. A parent component may be broken up into multiple sub-components. This arrangement of components and sub-components may be related in a hierarchy that represents the overall system.

In some situations, component designers or design teams may wish to exclude certain components from an overall hierarchy. For example, some developers and designers may build reusable components that enable reductions in design and implementation times of a component hierarchy, but reuse of components may result in a conflict between differing versions of components within the component hierarchy that must be addressed. In another example, some developers may wish to remove certain sub-components such that they can focus on a particular subset of the component hierarchy.

BRIEF DESCRIPTION OF THE DISCLOSURE

In one aspect, a computer-implemented method for filtering components from a logical component hierarchy is provided. The method uses a computing device having a processor and a memory. The method includes identifying, in the memory, a filter associated with the logical component hierarchy. The method also includes comparing, by the processor, a sub-component of the logical component hierarchy with the filter. The method further includes identifying the sub-component for filtration based on the comparison of the sub-component with the filter. The method also includes filtering the sub-component from the logical component hierarchy.

In another aspect, a computing device for filtering components from a logical component hierarchy is provided. The computer device includes a processor communicatively coupled to a memory. The memory includes the logical component hierarchy. The computing device is programmed to identify, in the memory, a filter associated with the logical component hierarchy. The computing device is also programmed to compare a sub-component of the logical component hierarchy with the filter. The computing device is further programmed to identify the sub-component for filtration based on the comparison of the sub-component with the filter. The computing device is also programmed to filter the sub-component from the logical component hierarchy.

In yet another aspect, at least one non-transitory computer-readable storage media having computer-executable instructions embodied thereon is provided. When executed by at least one processor, the computer-executable instructions cause the processor to identify a filter associated with a logical component hierarchy. The computer-executable instructions also cause the processor to compare a sub-component of the logical component hierarchy with the filter. The computer-executable instructions further cause the processor to identify the sub-component for filtration based on the comparison of the sub-component with the filter. The computer-executable instructions also cause the processor to filter the sub-component from the logical component hierarchy.

BRIEF DESCRIPTION OF THE DRAWINGS

FIG. 1 is a block diagram of an exemplary hierarchy of components.

FIG. 2 is a block diagram of versioned modules associated with the hierarchy of components shown in FIG. 1.

FIG. 3 is a snapshot of the versioned modules shown in FIG. 2 at a first time.

FIG. 4 is a snapshot of the contents of the versioned modules shown in FIG. 2 at a second time.

FIG. 5 is a block diagram of an exemplary hierarchy of components that includes filters.

FIG. 6 is a flowchart illustrating an exemplary hierarchy load process that identifies and integrates filtering references.

FIG. 7 is a block diagram of an exemplary hierarchy management system configured to implement filtering references within the hierarchy of components shown in FIG. 5.

FIG. 8 is a block diagram of a database within a computing device, along with other related computing components, that may be used to manage the hierarchy of components shown in FIG. 5.

FIG. 9 is an example is an example method for filtering components from the hierarchy shown in FIG. 5.

DETAILED DESCRIPTION OF THE DISCLOSURE

Figure 1:
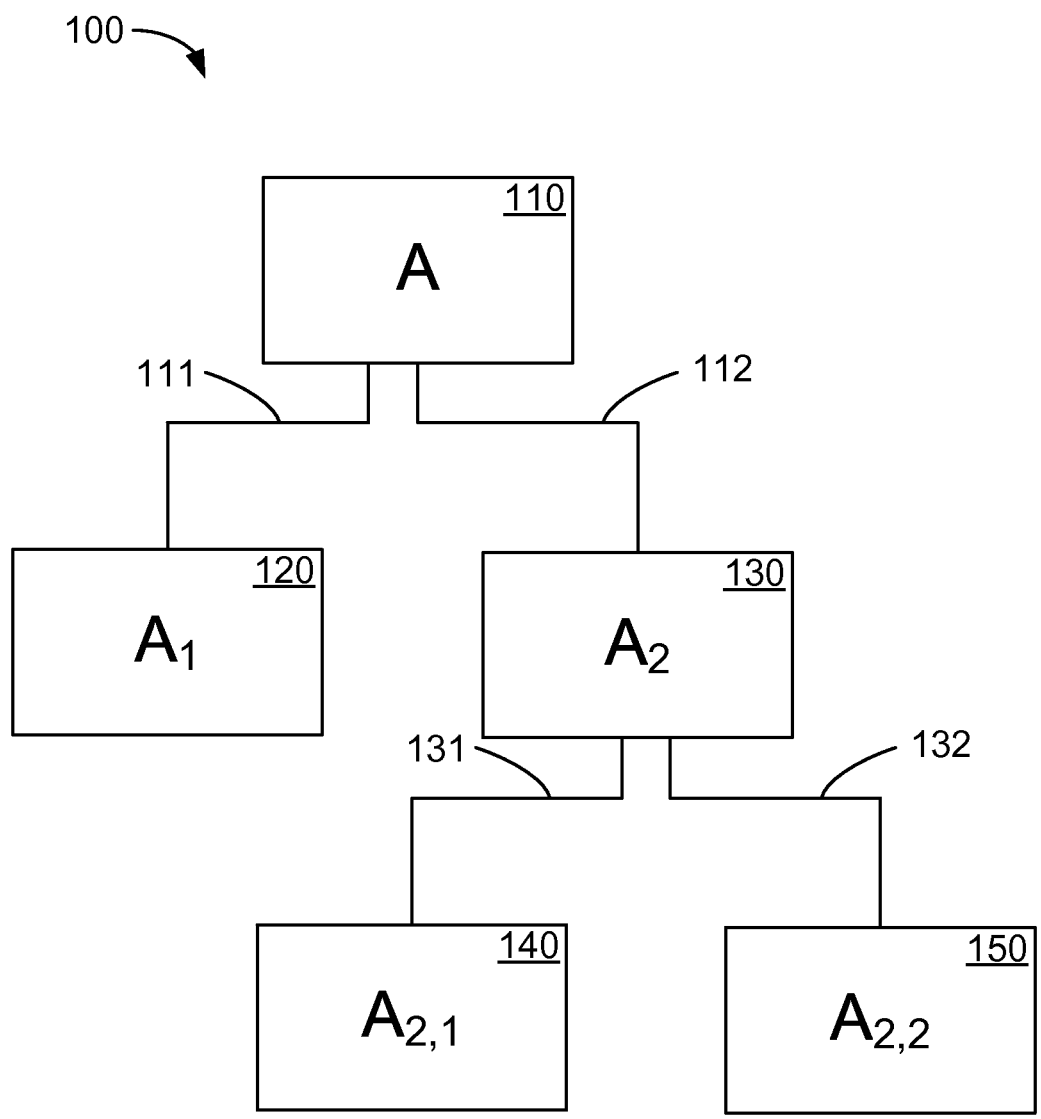
FIGS. 1-9 show exemplary embodiments of the methods and systems described herein.

The following detailed description illustrates embodiments of the disclosure by way of example and not by way of limitation. It is contemplated that the disclosure has general application to managing hierarchies of components.

As used herein, an element or step recited in the singular and proceeded with the word "a" or "an" should be understood as not excluding plural elements or steps, unless such exclusion is explicitly recited. Furthermore, references to "exemplary embodiment" or "one embodiment" of the present disclosure are not intended to be interpreted as excluding the existence of additional embodiments that also incorporate the recited features.

As used herein, the term "database" may refer to either a body of data, a relational database management system (RDBMS), or both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

In one embodiment, a computer program is provided, and the program is embodied on a computer readable medium. In an exemplary embodiment, the system is executed on a single computer system, without requiring a connection to a server computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

The development of hardware or software systems that include a plurality of components may be made more efficient when the design of the system is divided into smaller and more manageable designs of components of the system. To support the component hierarchy and address some of the problems that may arise during use of the hierarchy, one or more sub-components may be filtered out (i.e., excluded) from the overall hierarchy.

FIG. 1 is a hierarchical representation 100 of an exemplary product A 110 in which one or more components may be filtered or excluded as described herein. The product A 110 includes a first component $A_1$ 120 and a second component $A_2$ 130. The second component $A_2$ 130 includes two sub-components $A_{2,1}$ 140 and $A_{2,2}$ 150. The product A 110 has hierarchical associations 111 and 112 with components $A_1$ 120 and $A_2$ 130, respectively. Likewise, the component $A_2$ 130 has hierarchical associations 131 and 132 with sub-components $A_{2,1}$ 140 and $A_{2,2}$ 150, respectively. The product A 110 may include further components (not shown), which may, in turn, include further sub-components. Sub-components may also include further sub-components and so forth.

Hierarchical representations, such as 100, may also be formulated separately for components or sub-components of the product A 110 (e.g., representations that are subsets of the complete hierarchical representations 100 of the product A 110). In addition, while in this embodiment the element A 110 is a product, the element A 110 may also be considered as a component, wherein the element $A_1$ 120 and the element $A_2$ 130 may be considered as sub-components of the element A 110. Likewise, the element $A_{2,1}$ 140 and the element $A_{2,2}$ 150 may be considered as components, with hierarchical relationships to their sub-components (not shown).

The product A 110 may be representative of any hardware or software system that may be designed in a modular fashion. For example, the product A 110 may be a car, wherein the component $A_1$ 120 may be the frame and the component $A_2$ 130 may be the engine of the car. The sub-components $A_{2,1}$ 140 and $A_{2,2}$ 150 of the engine may be, for example, a crank shaft and a cylinder, respectively, of the engine. In another example, the product A 110 may be an integrated circuit (IC) chip, wherein the component $A_1$ 120 may be the random access memory (RAM) and the component $A_2$ 130 may be the computer processing unit (CPU) of the IC chip. The sub components $A_{2,1}$ 140 and $A_{2,2}$ 150 of the CPU may be, for example, an arithmetic logic unit (ALU) and a control unit, respectively, of the CPU.

During the development process, a design team for a particular component may have access to all current and prior designs of the component and/or sub-components of the component. A design team may be responsible for a component at any level on the hierarchical representation 100. For example, a design team may exist for development of the product A 110, as well as separate design teams for each of the product A's 110 components (e.g., the components $A_1$ 120 and $A_2$ 130). The design team for the product A 110 may be responsible for simulating and/or testing the product A 110 using particular designs of the components of product A 110.

Designs for the product A 110 and all of its components, $A_1$ 120 and $A_2$ 130, and sub-components, $A_{2,1}$ 140 and $A_{2,2}$ 150, may be included as files in modules that are stored in a central database or a distributed database (not shown in FIG. 1) for retrieval by any of the design teams. A module typically includes one or more files including software code and/or design data. Modules may contain other modules and they may be released and even packaged for re-use. In some implementations, a server-side database is used, such as, for example, a business objects database from Dassault Systèmes ENOVIA Corp. of Waltham, Mass. However, any other databases or combinations of databases that enable the operation of the systems and methods described herein may be used.

To help facilitate and track the development of a component, each design of the component, which is stored in a module, may have a specific version number associated with that module, e.g., a module and/or a component version.

Figure 2:
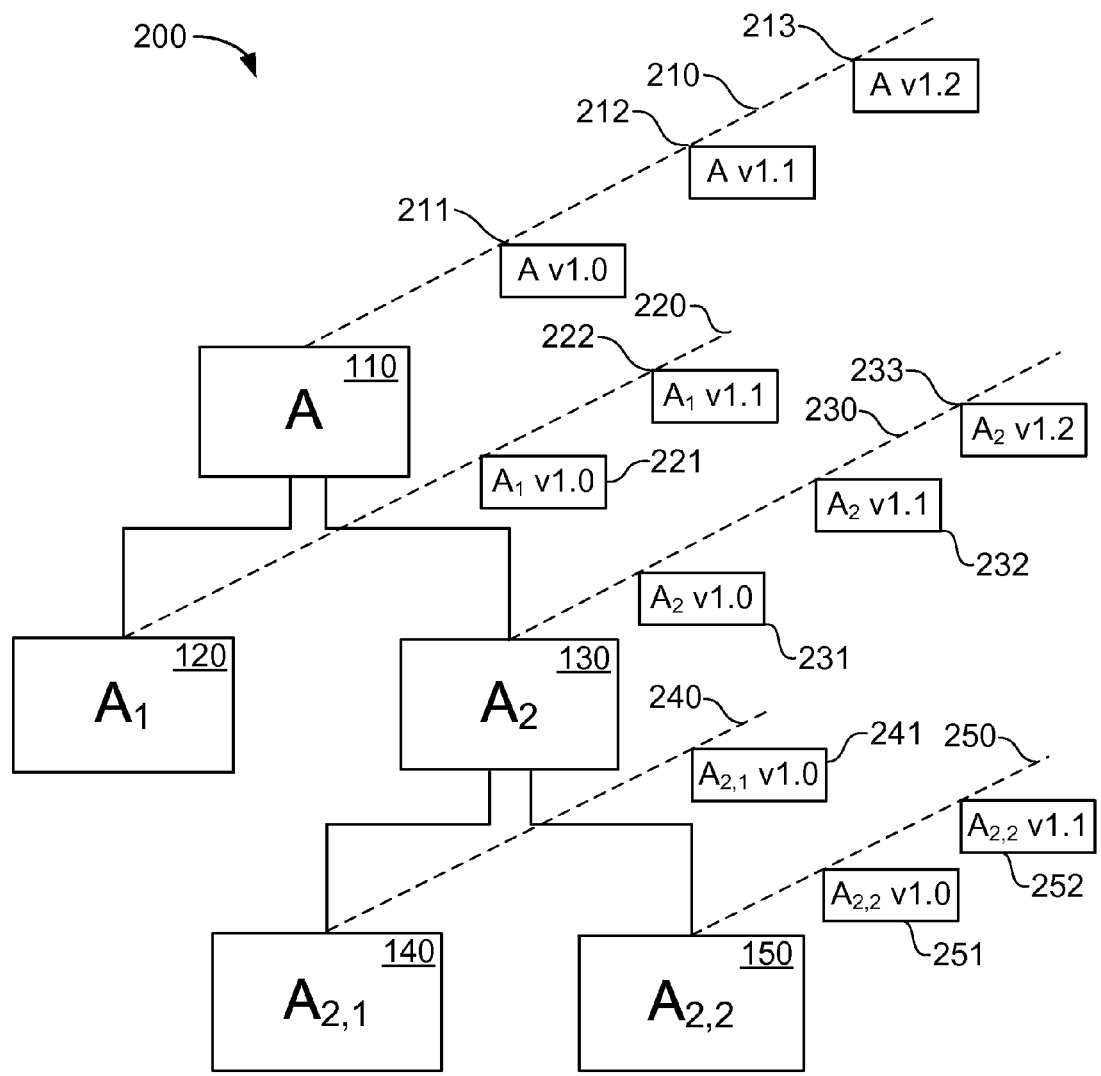

FIG. 2 illustrates a block diagram 200 of versioned modules associated with specific components, using the same hierarchy of components as illustrated in FIG. 1. The product A 110 may be associated with multiple modules with different module version numbers, e.g., modules A v1.0 211, A v1.1 212, and A v1.2 213.

The diagram 200 includes module branches 210, 220, 230, 240, and 250. A module branch represents the chronological progression of updates to a collection of objects that have a common association with a particular product, component, or sub-component. For example, the collection of modules A v1.0 211, A v1.1 212, and A v1.2 213 included or referenced by the module branch 210 are different versioned modules of the product A 110 that each represent a subsequent update or change to the antecedent versioned module. As used herein, modules sharing a common module branch may be referred to as "the same module," e.g., indicating that they are either the same or different versions of a common underlying module version lineage. Similarly, elements or components may also be referred to as "the same" if they share a common underlying version lineage, such as branches 210, 220, 230, 240, and 250. The module branch 220 refers to the collection of modules $A_1$ v1.0 221, and $A_1$ v1.1 222 that are different versioned modules associated with the component $A_1$ 120. The module branch 230 refers to the collection of modules $A_2$ v1.0 231, $A_2$ v1.1 232, and $A_2$ v1.2 233 that are different versioned modules associated with the component $A_2$ 130. The module branch 240 refers to the collection of module $A_{2,1}$ v1.0 241 associated with the sub-component $A_{2,1}$ 140. The module branch 250 refers to the collection of modules $A_{2,2}$ v1.0 251, and $A_{2,2}$ v1.1 252 that are different versioned modules associated with the sub-component $A_{2,2}$ 150.

A versioned module (e.g., the modules A v1.0 211, A v1.1 212, and A v1.2 213) conveys that the module was updated or changed at a specific point in time of a chronological progression of updates or changes to the design of the component (e. g., the product A 110). Any change to a component design from one module by one of the design teams can result in the creation of a new module with a new module version number. For example, the design team for the component $A_2$ 130 makes a change to the design of version 1.1 included in module $A_2$ v1.1 232 and creates module $A_2$ v1.2 233 with new version number 1.2 to save the new design. A particular component (e.g., the component $A_2$ 130) can have multiple design versions, each stored in separate modules (e.g., the modules $A_2$ v1.0 231, $A_2$ v1.1 232, and $A_2$ v1.2 233) with different version numbers (e.g., v1.0, v1.1, and v1.2).

Figure 3:
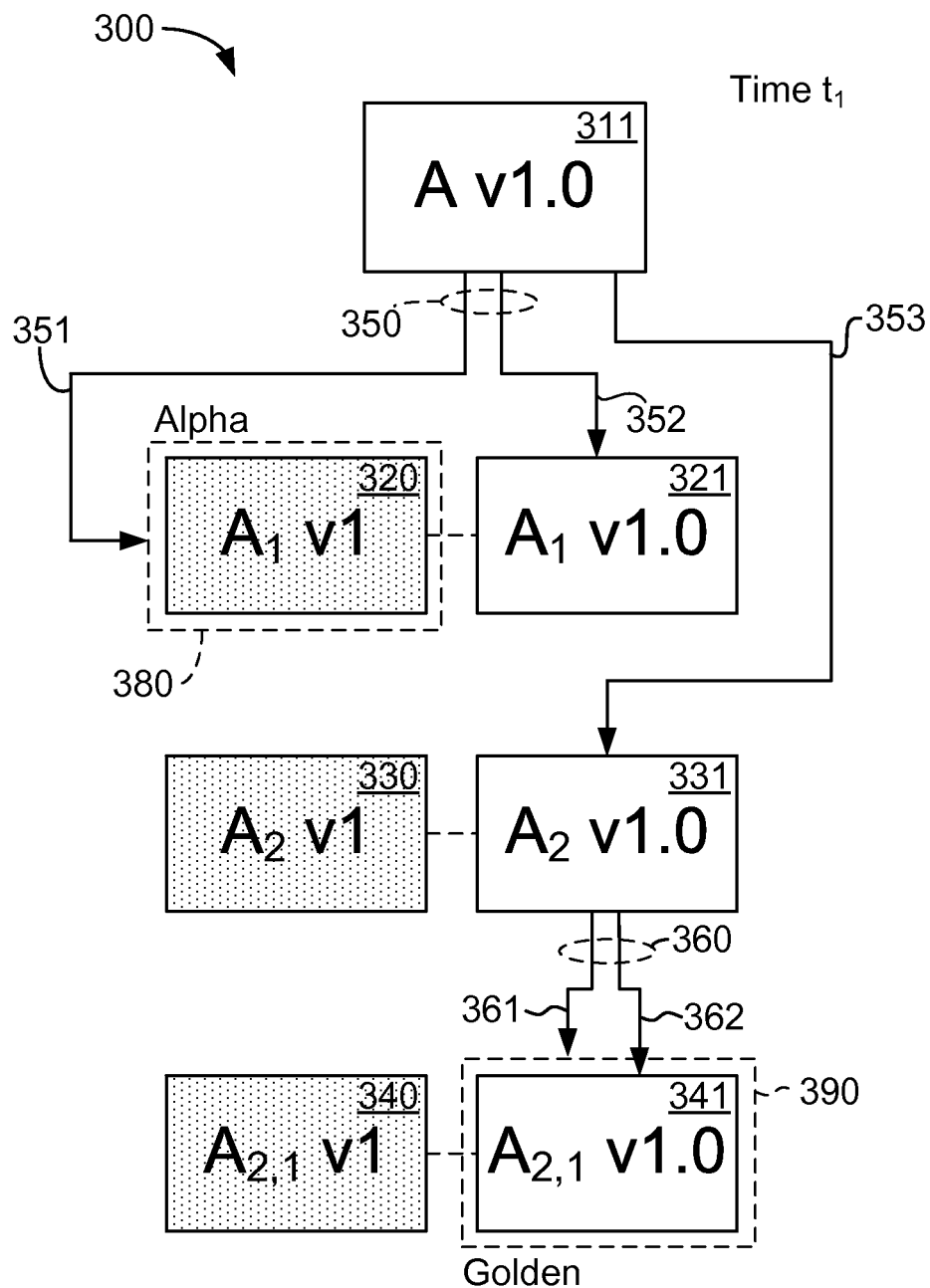
Figure 4:
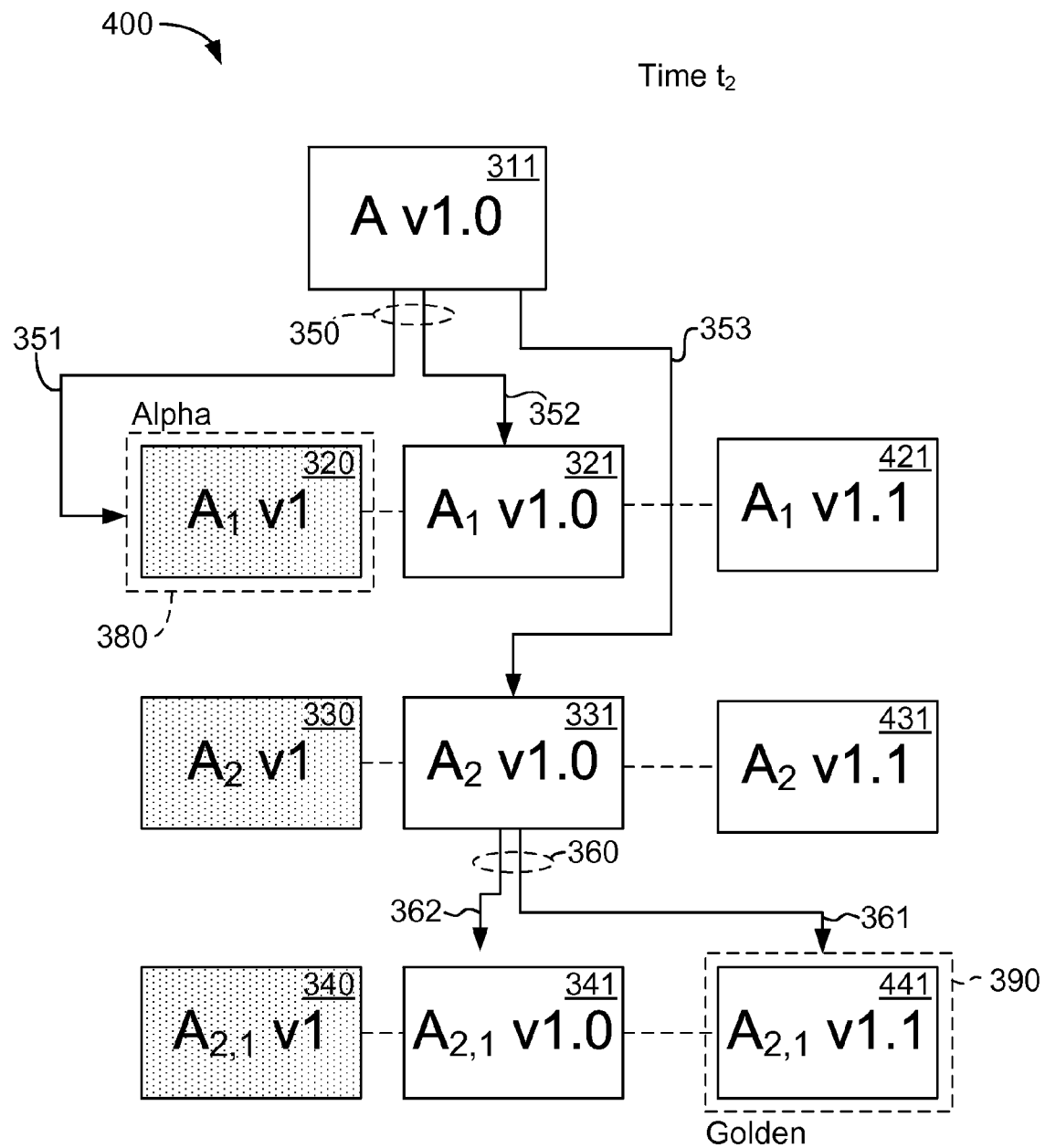

To further facilitate the development of a product or component, one or more hierarchical references may be stored in a component's modules that refer to particular sub-modules. FIGS. 3 and 4 illustrate examples of the different types of hierarchical references that may exist and change from time $t_1$ to $t_2$ between the module of a particular design of a product and the sub-modules associated with components of that product. FIGS. 3 and 4 use a portion of the hierarchical representation 100, wherein the product A 110 includes the two components, $A_1$ 120 and $A_2$ 130, and the component $A_2$ includes one sub-component $A_{2,1}$ 140. A sub-module may be any module that has been referenced by another module and associates with a sub-component of the component associated with the module. For example, in FIG. 3, modules $A_1$ v1.0 321 and $A_2$ v1.0 331 are sub-modules of the module A v1.0 311, and module $A_{2,1}$ v1.0 341 is a sub-module of the module $A_2$ v1.0 331. The module A v1.0 311 is associated with component A 110 and the sub-modules $A_1$ v1.0 321 and $A_2$ v1.0 331 are associated with sub-components $A_1$ 120 and $A_2$ 130, respectively.

FIG. 3 is an exemplary snapshot 300, at time $t_1$, of the contents of a database (not shown in FIG. 3) storing the modules for the product A 110 (shown in FIG. 2). The module A v1.0 311 includes version 1.0 of a design of the product A 110. Modules $A_1$ v1.0 321 and $A_2$ v1.0 331, respectively, include versions 1.0 of designs of the components $A_1$ 120 and $A_2$ 130 (both shown in FIG. 2). The module $A_{2,1}$ v1.0 341 includes version 1.0 of a design of the sub-component $A_{2,1}$ 140 (shown in FIG. 2). A module branch 320 refers to the chronological progression of the modules associated with the component $A_1$ 120 and includes or refers to, at time $t_1$, the module $A_1$ v1.0 321. A module branch 330 refers to the chronological progression of the modules for the component $A_2$ 130 and includes or refers to, at time $t_1$, the module $A_2$ v1.0 331. A module branch 340 refers to the chronological progression of the modules for the sub-component $A_{2,1}$ 140 and includes or refers to, at time $t_1$, the module $A_{2,1}$ v1.0 341.

Time $t_1$ may be, for example, the time at which the design team for the product A 110 first transfers the module A v1.0 311 to the database. The module A v1.0 311 includes the first design of the product A 110, which is assigned version number 1.0. The design team at or before this time defines a dynamic hierarchical reference 351 to the "alpha" tag 380 and a static hierarchical reference 353 to the module $A_2$ v1.0 331.

In the example of FIG. 3, a static hierarchical reference 352 is created that points to the module $A_1$ v1.0 321, which, as described below, is the module that the "alpha" tag 380 refers to at time $t_1$. Therefore, initially the hierarchical references 351 and 352, grouped as 350, both refer to the same module though they point to different objects. By automatically defining a static hierarchical reference at the time a dynamic hierarchical reference is created, a design team in the future can advantageously use this static hierarchical reference for determining the initial association of the dynamic hierarchical reference, even when the dynamic hierarchical reference points to subsequent versioned modules.

In a similar fashion, a dynamic hierarchical reference 361 for the module $A_2$ v1.0 331 is created by the design team for the component $A_2$ at or before the time this design team transfers or commits the module $A_2$ v1.0 331 to the database. In this example, the design team for the component $A_2$ defines the dynamic hierarchical reference 361 to point to the "golden" tag 390. The golden tag 390 initially points to module $A_{2,1}$ v1.0 341. A static hierarchical reference 362 is automatically defined to point to the same module that the dynamic hierarchical reference 361 initially points to, which is module $A_{2,1}$ v1.0 341. Initially, the hierarchical references 361 and 362, grouped as 360, both refer to the same module though they point to different objects.

In the illustrated example of FIG. 3, hierarchical references for a module associated with a component are created at the time the module is committed to the database. However, hierarchical references stored in a module may be added, deleted, or changed at any time after the module has been committed.

FIG. 4 is a snapshot 400, at a later time $t_2$, of the contents of the database (not shown in FIG. 4) storing the modules for the product A 110 (shown in FIG. 2). At a time between $t_1$ and $t_2$, the design teams for the components $A_1$ 120, $A_2$ 130, and $A_{2,1}$ 140, respectively, transfer new modules $A_1$ v1.1 421, $A_2$ v1.1 431, and $A_{2,1}$ v1.1 441. In addition, the design team for the component $A_{2,1}$ 140 moves the "golden" tag 390 from the module $A_{2,1}$ v1.0 341 to the module $A_{2,1}$ v1.1 441.

Generally, hierarchical references can be dynamic or static. A static hierarchical reference (e.g., hierarchical references 352, 353, and 362) refers to a module including a particular version of a component or sub-component. For example, the static hierarchical reference 352 refers to module $A_1$ v1.0 321, which includes version 1.0 of the design of component $A_1$ 120. On the other hand, a dynamic hierarchical reference (e.g., hierarchical references 351 and 361) can refer to a tag or to a module branch, which then refers to a particular module. Tags and module branches may change, thus the module that the dynamic hierarchical reference ultimately refers to can change. A tag may be manually changed by a user to refer to a different module. For example, the design team for the component $A_{2,1}$ 140 moves the "Golden" tag 390 from the module $A_{2,1}$ v1.0 341 to the module $A_{2,1}$ v1.1 441. A module branch may be changed by adding a new module (e.g., a new module version) to the module branch. For example, when the design team for component $A_1$ 120 transfers the new module $A_1$ v1.1 421 to the database, the module branch 320 changes such that it additionally includes or refers to the new module $A_1$ v1.1 421 (e.g., the module branch points to the latest version).

Tags of different types can be defined. For example, the most recent module of any component can be associated with an "alpha" tag, which may represent an "in-process" version of the component. In the example illustrated in FIG. 3, by defining an "alpha" tag 380 to refer to the branch 320, the "alpha" tag 380 refers to the module with the most recent version that the module branch 320 refers to or includes. In an alternative embodiment, the dynamic hierarchical reference 351 may point to the module branch 320 directly and the same result would apply. In another example (not illustrated), a module of a component may be tagged as "beta," which may represent a "testing" version of the component. A module of a component may also be tagged as "golden," which may represent the latest "stable" version of the component. In the example illustrated in FIG. 3, the design team for the component $A_{2,1}$ 140 initially defines version 1.0 of the component $A_{2,1}$ 140 as the "golden" version. Each of the "alpha", "beta", and "golden" tags are dynamic, because they are changeable (e.g., a design group may change the tag to point to a different versioned module) and thus do not always refer to the same module over time.

Figure 5:
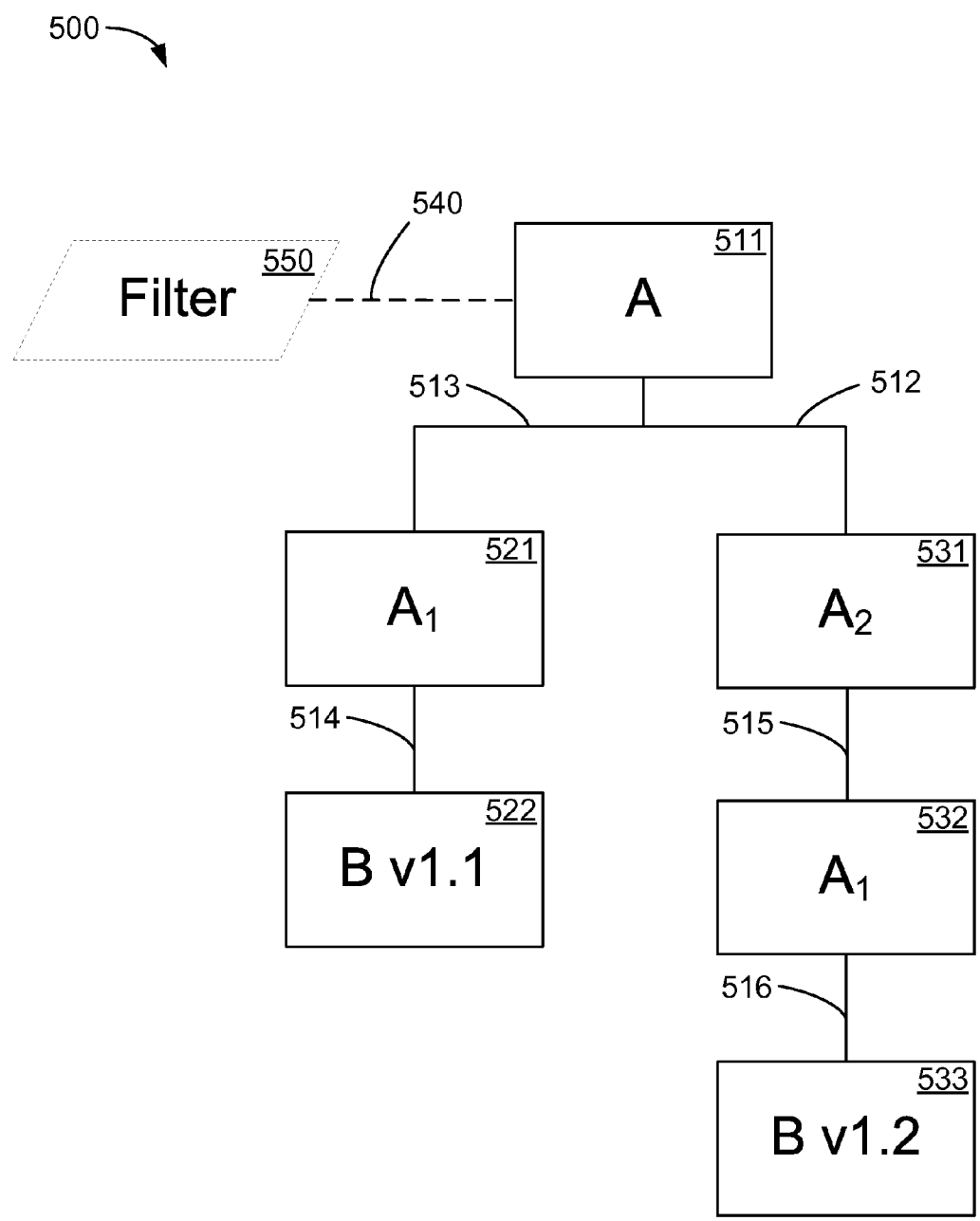

FIG. 5 is a hierarchical representation ("hierarchy") 500 of an exemplary product A 511 that includes filtering of components. The product A 511 (also referred to herein as the "head component" or the "root" component of hierarchy 500) includes a first component $A_1$ 521 and a second component $A_2$ 531. Product A 511 may be similar to the product A 110 (shown in FIGS. 1 and 2), or to Product A v1.0 311 (shown in FIGS. 3 and 4), and components $A_1$ 521 and $A_2$ 531 may be similar to products $A_1$ 120 and $A_2$ 130 (shown in FIGS. 1 and 2) or $A_1$ v1.0 321 and $A_2$ v1.0 331 (shown in FIGS. 3 and 4). The first component $A_1$ 521 includes one sub-component B v1.1 522. The second component $A_2$ 531 includes one sub-component $A_1$ 532, which itself includes a sub-component B v1.2 533. Note that product A 511 contains two separate $A_1$ components, $A_1$ 521 and $A_1$ 532, where one is a direct child of the product A 511 itself, and the other is a child of $A_2$ 531. Similarly, product A 511 contains two separate B components, B v1.1 522 and B v1.2 533, and these two B components reference different version numbers of the same component.

The product A 511 has hierarchical associations 512 and 513 with components $A_1$ 521 and $A_2$ 531, respectively. Likewise, the component $A_1$ 521 has a hierarchical association 514 with sub-component B v1.1 522, the component $A_2$ 531 has a hierarchical association 515 with sub-component $A_1$ 532, and sub-component $A_1$ 532 has a hierarchical association 516 with sub-component B v1.2 533. It should be understood that while each component in hierarchy 500 may include a version identifier such as a version number, version numbers for components A 511, $A_1$ 521, and $A_2$ 531 have been excluded for purposes of focus and readability.

The terms "descendent," "ancestor," "parent," and "child," as used herein, refer to logically-familial, hierarchical relationships between components (e.g., a tree structure of components). For example, component B v1.1 522 may be referred to as a descendent of its ancestors, $A_1$ 521 and A 511. Component $A_1$ 521 is the parent of component B v1.1 522 (i.e., the first adjoining, immediate ancestor) and, likewise, component B v1.1 522 is the child of component $A_1$ 521. Further, component $A_1$ 521 is itself the descendent (in this case, a child) of component A 511 (i.e., its parent). As such, these terms may be used for convenience to define and describe these logical relationships between components.

In the example embodiment, hierarchy 500 includes a filter 550 that is used to identify and filter one or more components. As used herein, the term "filtration component" is used to refer generally to the components that a filter such as filter 550 identifies for filtration. The term "filtration" generally refers to the exclusion, removal, or other elimination of a component (i.e., the filtration component) from a hierarchy such as hierarchy 500. Hierarchy 500, as shown in FIG. 5, is an unmodified (i.e., unfiltered) representation of a component structure. In other words, hierarchy 500 represents a full view of a component design prior to application of filter 550. After application of filter 550, one or more components may be removed or otherwise not incorporated into hierarchy 500.

Filter 550 and the filtering of components, as described herein, are defined and described in one or more aspects. In a scope aspect, filter 550 defines a scope or layer of effect at which filter 550 will be applied. In an identification aspect, filter 550 defines one or more identification criteria that operate to identify which component or components to filter. During operation, one or more of these aspects of filter 550 serve to identify components for filtration from hierarchy 500. Each of these aspects is described in greater detail below.

The scope aspect of filter 550 identifies the set or subset of components which may be considered for filtration. In the example embodiment, filter 550 operates based on hierarchical relationships, and more specifically operates as an umbrella based on a level of application within a hierarchy. Filter 550 is attached 540 to the head component A 511. As such, the scope of filter 550 is the entire tree structure of hierarchy 500. In other embodiments, filter 550 may be attached to another component such as, for example, $A_1$ 532. As such, the scope of the filter would then be only the sub-tree of $A_1$ 532 (i.e., the structure at and below $A_1$ 532). In attached filter embodiments, such as filter 550, because the filter defines the highest level in which the filter is applied, only sub-components at or below the level of the attachment may be candidates for filtration. In still other embodiments, filter 550 may be unattached. Such unattached filters are interpreted as applicable to the entire hierarchy 500. In other words, an unattached filter is similar to filter 550 when it is attached 540 to the root node, giving it the broadest scope. As used herein, the term "scope criteria" is used to refer to one or more criterion that serve to limit the scope of filtration, or the set of components to which the filter will be considered. In the example embodiment, attachment 540 of filter 550 serves as scope criteria.

The identification aspect of filter 550 identifies which components to filter, exclude, or otherwise remove from hierarchy 500. As used herein, the term "identification criteria" is used to refer to one or more criteria that serve to identify components for filtration. In the example embodiment, the identification of filtration components is limited by the scope defined by the scope criteria as described above. In other embodiments, identification criteria may operate without scope criteria, and may operate alone or in conjunction with other criteria to identify filtration components.

Components and/or sub-components may be identified for filtration based on the structure of hierarchy 500 in several ways. In some embodiments, filtration components are identified by an "absolute hierarchical name" within hierarchy 500 (i.e., a specific relational path or location with respect to the root node or the node in which the filter is attached). In other embodiments, filtration components are identified using a sub-component structure (also referred to herein as a "relative hierarchical name"). In still other embodiments, filtration components are identified using other identification criteria. Each of these filtration criteria are described in greater detail below.

Each component within hierarchy 500 may be uniquely identified based on the component's location within the hierarchy. As used herein, the terms "path" and "hierarchical name" refers generally to a location definition for a component within a hierarchy as traversed from the root node (or the filter attachment node) down to the component, or from the component up toward the root node (or the filter attachment node).

"Absolute hierarchical name" filtration criteria, in the example embodiment, are used to identify filtration components based on a particular path within hierarchy 500. More specifically, an "absolute hierarchical name" defines a path down from a root node (or the filter attachment node), such as head component A 511 (which in the example embodiment is both the root node of hierarchy 500 as well as the attachment node for filter 550). For example, a component such as B v1.1 522 may be identified as having an absolute hierarchical name of $\{A, A_1, B\}$. The example notation indicates a filtration component as component B (the last component in the list) that has a parent $A_1$ that is attached to the root node A. In other words, traversing from the root node A, the filtration component may be identified by stepping down to the component $A_1$, then locating the child node B (in this case, the node B v1.1 522). As such, filter 550 may include an identification criteria including an absolute hierarchical name of $\{A, A_1, B\}$, which would serve to identify B v1.1 522 as a filtration component.

In some embodiments, the identification criteria may include the head component, A in this example, or may exclude the head component and infer the first node as being head component A (e.g., in an unattached filter scenario) or may infer the first node as being the filter attachment node A (e.g., in an attached filter scenario). In other words, in the above example, the absolute hierarchical name to component B v1.1 522 may be represented by the absolute hierarchical name $\{A_1, B\}$.

In another example representing an absolute hierarchical name from a filter attachment node (instead of the root node), presume filter 550 is attached to component $A_2$ 531. As such, using a notation and embodiment that infers the first node as the attachment node, an absolute hierarchical name such as $\{A_1, B\}$ from a filter attachment node of $A_2$ 531 serves to identify node B v1.2 533. Accordingly, a filter attached to $A_2$ 531 that includes identification criteria of $\{A_1, B\}$ would serve to filter node B v1.2 533 from the hierarchy.

It should be understood that the notation provided is merely one exemplary method for notating and representing hierarchy relationships between nodes in a hierarchy (i.e., relational paths). Any such means for indicating or identifying the path structure of a component within a hierarchy that enables the systems and methods described herein may be used. As such, each node in the hierarchy may be identified based on an absolute hierarchical name to the root node, or to the filter attachment node.

"Relative hierarchical name" filtration criteria, in the example embodiment, are used to identify filtration components based on a sub-component structure that is defined by a path upward from the filtration component. More specifically, a "relative hierarchical name" is a relational path that defines a path within the hierarchy relative to the filtration component. For example, presume filter 550 includes a relative hierarchical name type identification criteria including $\{A_1, B\}$. Relative hierarchical name type identification criteria may be described as defining a sub-structure that must match to identify a filtration component. Relative hierarchical name criteria are still ordered in a top-down fashion (e.g., $A_1$ is the parent of B), but they are matched based on the node relationship defined within. In other words, in the example identification criteria $\{A_1, B\}$, a particular component B will match (i.e., will be identified as a filtration component) if its parent is component $A_1$. In hierarchy 500, there are two sub-structures that match the identification criteria $\{A_1, B\}$—both component B v1.1 522 and component B v1.2 533 (because both are B components, and both have an $A_1$ component as their parent).

As such, relative hierarchical name type identification criteria may be described as an ordered list including, as the last element, the filtration component, plus optionally one or more ancestors of the filtration component. In the example embodiment, no ancestors are skipped over in the list (i.e., the list includes an unbroken chain of ancestors, though not necessarily all ancestors). In some embodiments, a list entry of a relative hierarchical name list may include "wildcards" (i.e., '*', '?', etc.) as a part of component matching. For example, the above example list may be represented as $\{*, A_1, B\}$, indicating that any additional ancestors of $A_1$ will match. Further, a list entry may include sets of one or more components. For example, a list $\{(A_1, A_2), B\}$ identifies a first list element that includes $A_1$ or $A_2$. As such, a B component matches the identification criteria if its parent is either an $A_1$ component or an $A_2$ component.

At one extreme, in the example embodiment, a hierarchical name type identification criterion that includes all ancestors of a filtration component up to the root node is equivalent to an absolute hierarchical name of the filtration component, thereby identifying the specific node alone. At the other extreme, the list includes only the filtration component itself with no ancestors, thereby identifying all nodes that match the given filtration component. As such, relative hierarchical name type identification criteria may identify multiple filtration components.

Further, in the example embodiment, filter 550 may include scope criteria along with relative hierarchical name type identification criteria. FIG. 5 illustrates an attached filter (i.e., filter 550 attached 540 to a filter attachment component A 511) and, as such, the example relative hierarchical name type identification criteria of $\{A_1, B\}$ would match on both component B v1.1 522 and B v1.2 533, as described above. Alternatively, consider the same identification criteria but in a filter attached to node $A_2$ 531. In other words, the scope of the filter is limited to just the sub-hierarchy defined underneath $A_2$ 531 (i.e., with $A_2$ 531 as the "root" node of the sub-structure). As such, only component B v1.2 533 would be identified as a filtration component.

In some embodiments, identification criteria may include other component identification information that may be used to distinguish some components from other components, such as, for example, a component identifier (e.g., a URL), a version identifier (e.g., a version number), a hierarchical name, and/or an href. Further, identification criteria may be combined together using traditional logical operators (AND, OR, NOT, etc.) for combined effects, such as, for example, matching on a relative hierarchical name list AND a component version.

Additionally, multiple filters such as filter 550 may be provided within hierarchy 500. Filters may have differing scopes and/or differing identification criteria.

During operation, in the exemplary embodiment, a computing system, such as hierarchy management system (HMS) 720 (shown in FIG. 7) or computing device 810 (shown in FIG. 8), is responsible for reading and building hierarchical representations of products and/or components, such as hierarchical representation 500 of product A 511 within a computer-aided drafting system. HMS 720 loads component modules into data structures within a working memory of the system. Further, a user defines one or more filters 550 along with any scope criteria and/or identification criteria (also referred to herein as filter definitions). In the exemplary embodiment, the user provides the filter definitions prior to loading hierarchy 500 into system memory. In other embodiments, the user provides the filter definitions to HMS 720, and HMS 720 applies filters 550 to an already-loaded hierarchy 500.

In the example embodiment, presume the user defines filter 550 with scope criteria as shown (i.e., attached to the root node, A 511, thereby), and with a relative hierarchical name type identification criteria of $\{A_2, A_1, B\}$ (i.e., filter any B component that has an $A_1$ as its parent and $A_2$ as its grandparent). Hierarchy 500 is populated starting from the root node in a depth-first fashion. Prior to loading a sub-component, HMS 720 evaluates existing filters 550 to determine if the sub-component matches as a filtration component. HMS 720 loads component A 511 as the root node. In some known systems, the sub-component $A_1$ 521 would be immediately processed (i.e., the data structure of the child component 521 would be immediately loaded into the hierarchy based on the hierarchical reference of the parent component A 511). In the exemplary embodiment, however, before loading each sub-component, HMS 720 examines the sub-component (e.g., the first child $A_1$ 521) as a filtration candidate by comparing the sub-component to the filters (e.g., 550). $A_1$ 521 does not match filter 550 (i.e., it is not a B component, the last component in the list). As such, HMS 720 loads $A_1$ 521 and descends to examine the children of $A_1$ 521. The only child of $A_1$ 521 is B v1.1 522, which HMS 720 compares against filter 550. B v1.1 522 is a B node, thus matches the last element of the list. Further, the parent of B v1.1 522 is $A_1$ 521, which is an $A_1$ and matches the second element of the list. However, the grandparent of B v1.1 522 (i.e., the parent of $A_1$ 521) is A 511, which does not match the first component of the list (i.e., $A_2$). As such, component B v1.1 522 does not match filter 550, and thus HMS 720 loads component B v1.1 522 and continues processing with the next child of A 511.

In the exemplary embodiment, HMS 720 examines the second child of A 511, the component $A_2$ 531. This child does not match as a filtration component because it is not a B component. Accordingly, HMS 720 loads component $A_2$ 531 and proceeds to investigate the only child, $A_1$ 532. Since $A_1$ 532 is also not a B component, HMS 720 loads $A_1$ 532 and proceeds to examine the only child, B v1.2 533. This child is a B component, and thus matches the last element of the list of filter 550. Further, its parent is an $A_1$ component, and its grandparent is an $A_2$ component. Accordingly, HMS 720 identifies component B v1.2 533 as a filtration component and does not load the component into hierarchy 500.

The above examples with respect to FIG. 5 are described as conducted during a new structure load (i.e., during an initial build of a hierarchy of components within a memory). However, it should be understood that other implementations of filtering hierarchy components are possible and within the scope of this disclosure. For example, component filtration may be performed with an already built structure (e.g., a hierarchy already loaded into working memory), thereby deleting any components that match filters. Further, in other embodiments, HMS 720 may perform a breadth-first search, or any other traversal method that enables the systems and methods described herein.

Figure 6:
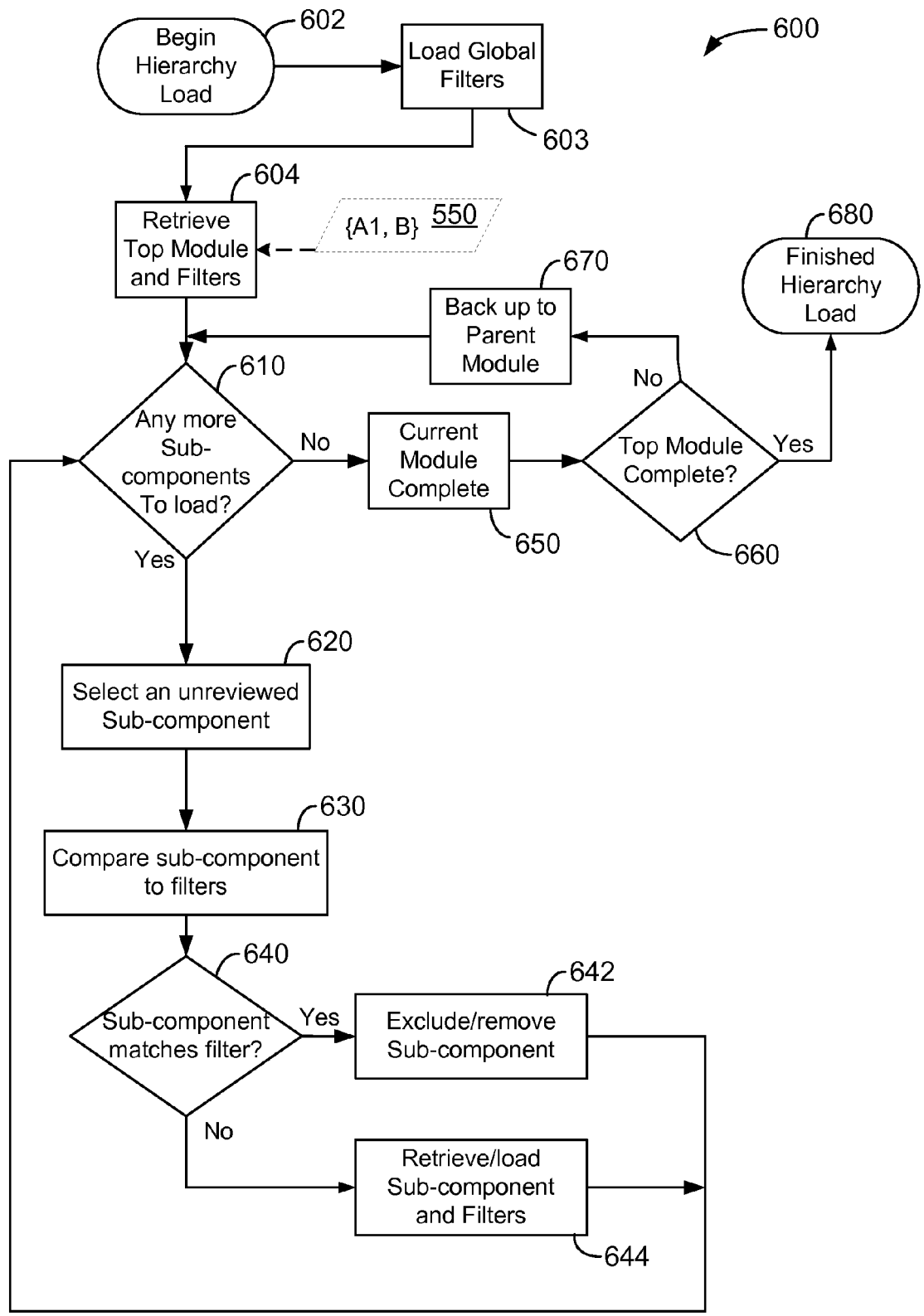

FIG. 6 is a flowchart illustrating an exemplary hierarchy load process 600 for identifying and integrating filtering references. In the exemplary embodiment, process 600 is performed using a computing system, such as HMS 720 (shown in FIG. 7) or computing device 810 (shown in FIG. 8). A design team inputs a request for a version of their module (e.g., a component hierarchy), such as for product A 511 (shown in FIG. 5). In the exemplary embodiment, HMS 720 loads 602 a hierarchical structure associated with product A 511 of hierarchy 500 as illustrated in FIG. 5. The top level module, and each module subsequently referenced, may include reference to one or more sub-components. Each sub-component may also have an associated module, which may also include reference to one or more sub-components, and so on.

In some embodiments, HMS 720 first loads 603 global filters (i.e., filters that apply to the entire scope of hierarchy 500). In the exemplary embodiment, HMS 720 then starts the module load process by retrieving 604 the module for product A 511 and incorporating it into hierarchy 500, as represented by element 511 (i.e., data structures for the top-level product are created in memory, including data imported from the top module). As a part of the top module load process, HMS 720 also loads any filters attached to the top module. In the present example, HMS 720 loads filter 550 that is attached 540 to the top module A 511. As such, filter 550 has a scope covering the entire hierarchy 500, and will match on any B component that has a parent of $A_1$ (i.e., depicted as "{A1, B}" in the example shown in FIG. 6).

At step 610, HMS 720 examines whether the current module being processed (at this stage, the top module associated with product A 511) has any sub-components that have not yet been processed (i.e., that have not yet been imported into hierarchy 500). As illustrated on FIG. 5, the top module references components $A_1$ 521 and $A_2$ 531. If there are one or more un-reviewed sub-components remaining, then HMS 720 selects 620 an un-reviewed sub-component for import. Accordingly, HMS 720 selects 620 the first un-reviewed sub-component, $A_1$ 521.

Prior to fully importing the sub-component $A_1$ 521, HMS 720 analyzes the sub-component for filtration (i.e., to determine if the current sub-component should be excluded or removed from hierarchy 500). HMS 720 compares 630 the sub-component for any matching filters. If 640 the current sub-component matches one or more filters, then that sub-component is excluded 642 (or removed) from hierarchy 500. If 640 the current sub-component does not match one or more filters, then HMS 720 retrieves/loads 644 the module associated with the sub-component being analyzed and imports that module into hierarchy 500. In the example, sub-component $A_1$ 521 does not match filter 550, and thus HMS 720 loads 644 this sub-component (i.e., component $A_1$ 521 is added as a child of A 511).

In the exemplary embodiment, as a part of retrieving 644 the sub-component module, this sub-component becomes the current module under review. HMS 720 loops up to consider sub-components of component $A_1$ 521 at step 610. In this example, component $A_1$ 521 has one sub-component, B v1.1 522. HMS 720 selects 620 un-reviewed sub-component B v1.1 522 and compares 630 this sub-component to filter 550 (i.e., the only active filter). At this stage, hierarchy 500 includes two loaded nodes (i.e., two components), $A_1$ 521 (the parent of B v1.1 522), and A 511 (the grandparent of B v1.1 522). HMS 720 determines that sub-component B v1.1 522 matches filter 550 because it is a B component whose parent is an $A_1$ component. As such, HMS 720 excludes 642 (or removes) component B v1.1 522 from hierarchy 500 and loops back to step 610. In other words, after considering the branch including A 511, $A_1$ 521, and B v1.1 522, along with filter 550 as attached to the head component, HMS has loaded only components A 511 and $A_1$ 521, but has excluded (or removed) component B v1.1 522 from hierarchy 500 based on the filter 550.

Continuing the example, the sub-component B v1.1 522 is excluded, and thus no deeper children of that component would be investigated. As such, at step 610, component $A_1$ 521 no longer has any un-reviewed sub-components. As such, HMS 720 then completes 650 the current module. HMS 720 next examines 660 whether the top module has been completed. If not, HMS 720 returns 670 to the parent of the current (i.e., the just completed) component for further analysis. In other words, once each of a component's sub-components are completely reviewed, HMS 720 ascends to the parent of that component at step 670 to continue processing of the parent's other sub-components. HMS 720 is finished 680 when the top module has been completely reviewed at step 660 (i.e., when all of the top module's sub-components have been reviewed).

In similar fashion, HMS 720 then investigates the next un-reviewed sub-component of the head component A 511, which includes the line of the component $A_2$ 531 fathering a sub-component $A_1$ 532, which includes a child B v1.2 533 as shown in FIG. 5. Using the looping of process 600 as described above from step 610, HMS 720 also matches and excludes child B v1.2 533 because it is a B component with an $A_1$ parent (i.e., matching filter 550). As such, only components $A_2$ 531 and $A_1$ 532 of this branch would be loaded into hierarchy 500.

In the exemplary embodiment, HMS 720 describes a depth-first approach to examination and construction of hierarchy 500 (i.e., at investigation of each new component, HMS 720 steps down into and fully examines the first sub-component before reviewing the other sub-components). However, it should be understood that any other approach to traversing and building hierarchy 500 that enables operation of the systems and methods described herein such as, for example, a breadth-first approach (i.e., reviewing all components at a level before stepping down into any of the sub-components), may be used. Further, filter 550 describes only a scope criteria (i.e., at and below head component A 511, based on the point of logical attachment) and an identification criteria including only component type of the filtration component and its parents. It should be understood, however, that other criteria for scope and identification are possible and within the scope of the present disclosure.

Figure 7:
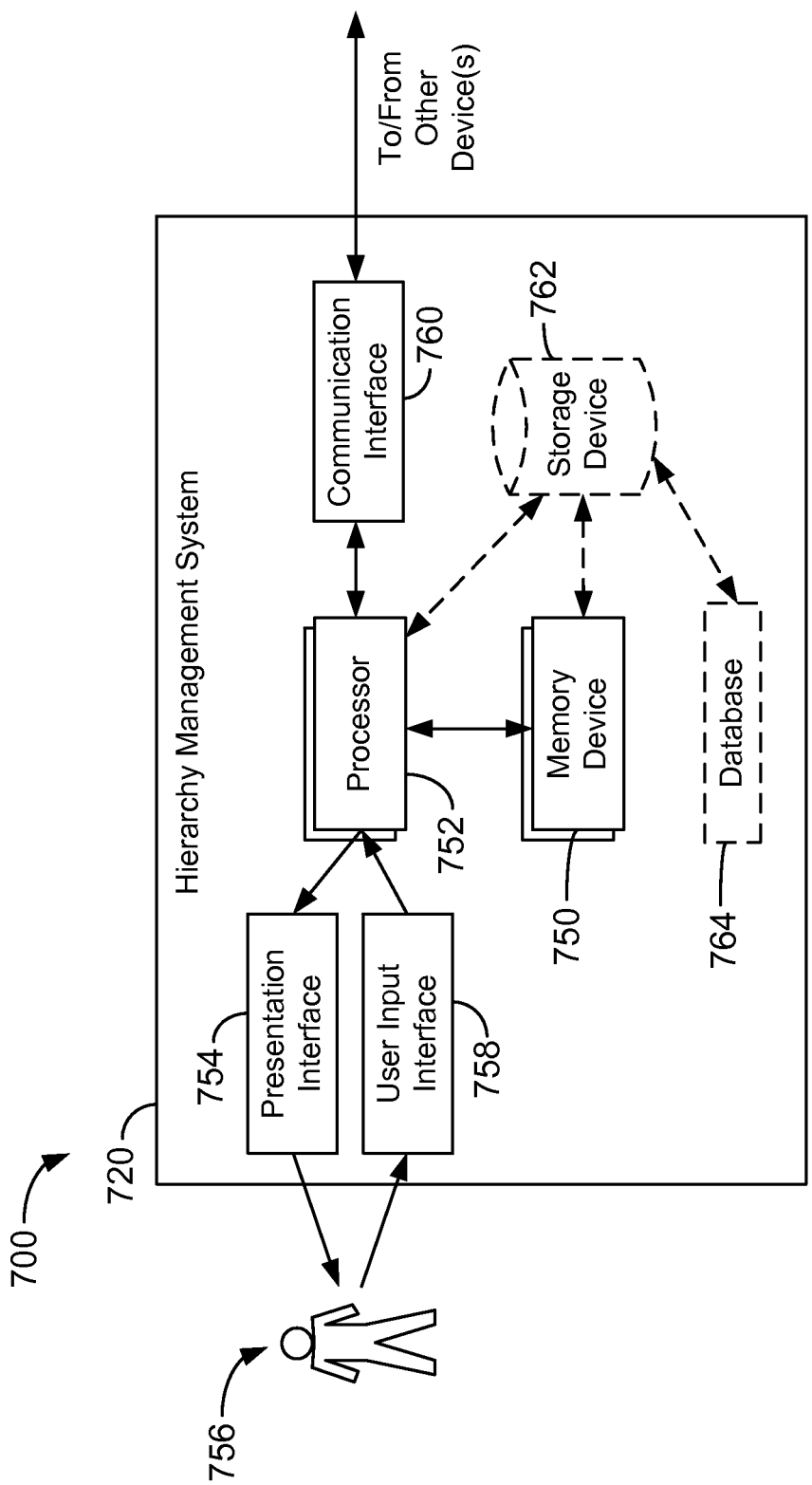

FIG. 7 is a block diagram 700 of an exemplary hierarchy management system 720 used to implement filtering references within component design hierarchies such as hierarchy 500 (shown in FIG. 5). Alternatively, any computer architecture that enables operation of hierarchy management system 720 as described herein may be used. In the exemplary embodiment, hierarchy management system 720 facilitates constructing component design hierarchies in data structures within a memory device 750 and enables filtering reference and component exclusion or removal as describe by processes 600 in reference to FIG. 6.

In the exemplary embodiment, hierarchy management system 720 includes a memory device 750 and a processor 752 operatively coupled to memory device 750 for executing instructions. In some embodiments, executable instructions are stored in memory device 750. Hierarchy management system 720 is configurable to perform one or more operations described herein by programming processor 752. For example, processor 752 may be programmed by encoding an operation as one or more executable instructions and providing the executable instructions in memory device 750. Processor 752 may include one or more processing units, e.g., without limitation, in a multi-core configuration.

In the exemplary embodiment, memory device 750 is one or more devices that enable storage and retrieval of information such as executable instructions and/or other data. Memory device 750 may include one or more tangible, non-transitory computer-readable media, such as, without limitation, random access memory (RAM), dynamic random access memory (DRAM), static random access memory (SRAM), a solid state disk, a hard disk, read-only memory (ROM), erasable programmable ROM (EPROM), electrically erasable programmable ROM (EEPROM), and/or non-volatile RAM (NVRAM) memory. The above memory types are exemplary only, and are thus not limiting as to the types of memory usable for storage of a computer program.

In the exemplary embodiment, memory device 750 may be configured to store a variety of component and module data associated with various components and sub-components in data structures, files, or other memory areas. Further, memory device 750 may also store component relationship data, filter data, and hierarchy data such as hierarchy 500, or other component-related data such as shown in FIGS. 1-5. Further, memory device 750 may also store filtering reference data such as shown in FIG. 5.

In some embodiments, hierarchy management system 720 includes a presentation interface 754 coupled to processor 752. Presentation interface 754 presents information, such as a user interface and/or an alarm, to a user 756. For example, presentation interface 754 may include a display adapter (not shown) that may be coupled to a display device (not shown), such as a cathode ray tube (CRT), a liquid crystal display (LCD), an organic LED (OLED) display, and/or a hand-held device with a display. In some embodiments, presentation interface 754 includes one or more display devices. In addition, or alternatively, presentation interface 754 may include an audio output device (not shown), e.g., an audio adapter and/or a speaker.

In some embodiments, hierarchy management system 720 includes a user input interface 758. In the exemplary embodiment, user input interface 758 is coupled to processor 752 and receives input from user 756. User input interface 758 may include, for example, a keyboard, a pointing device, a mouse, a stylus, and/or a touch sensitive panel, e.g., a touch pad or a touch screen. A single component, such as a touch screen, may function as both a display device of presentation interface 754 and user input interface 758.

In the exemplary embodiment, a communication interface 760 is coupled to processor 752 and is configured to be coupled in communication with one or more other devices such as, another computing system, or any device capable of accessing hierarchy management system 720 including, without limitation, a portable laptop computer, a personal digital assistant (PDA), and a smart phone. Communication interface 760 may include, without limitation, a wired network adapter, a wireless network adapter, a mobile telecommunications adapter, a serial communication adapter, and/or a parallel communication adapter. Communication interface 760 may receive data from and/or transmit data to one or more remote devices. Hierarchy management system 720 may be web-enabled for remote communications, for example, with a remote desktop computer (not shown).

In the exemplary embodiment, presentation interface 754 and/or communication interface 760 are capable of providing information suitable for use with the methods described herein, e.g., to user 756 or another device. Accordingly, presentation interface 754 and/or communication interface 760 may be referred to as output devices. Similarly, user input interface 758 and/or communication interface 760 are capable of receiving information suitable for use with the methods described herein and may be referred to as input devices.

Further, processor 752 and/or memory device 750 may also be operatively coupled to a storage device 762. Storage device 762 is any computer-operated hardware suitable for storing and/or retrieving data, such as, but not limited to, data associated with a database 164. In the exemplary embodiment, storage device 762 is integrated in hierarchy management system 720. For example, hierarchy management system 720 may include one or more hard disk drives as storage device 762. Moreover, for example, storage device 762 may include multiple storage units such as hard disks and/or solid state disks in a redundant array of inexpensive disks (RAID) configuration. Storage device 762 may include a storage area network (SAN), a network attached storage (NAS) system, and/or cloud-based storage. Alternatively, storage device 762 is external to hierarchy management system 720 and may be accessed by a storage interface (not shown).

Moreover, in the exemplary embodiment, database 764 contains a variety of static and dynamic operational data associated with components, modules, filters, and hierarchies.

The embodiments illustrated and described herein as well as embodiments not specifically described herein but within the scope of aspects of the disclosure, constitute exemplary means for managing component hierarchies that include filtering references. For example, hierarchy management system 720, and any other similar computer device added thereto or included within, when integrated together, include sufficient computer-readable storage media that is/are programmed with sufficient computer-executable instructions to execute processes and techniques with a processor as described herein. Specifically, hierarchy management system 720 and any other similar computer device added thereto or included within, when integrated together, constitute an exemplary means for managing component hierarchies that include component filters.

Figure 8:
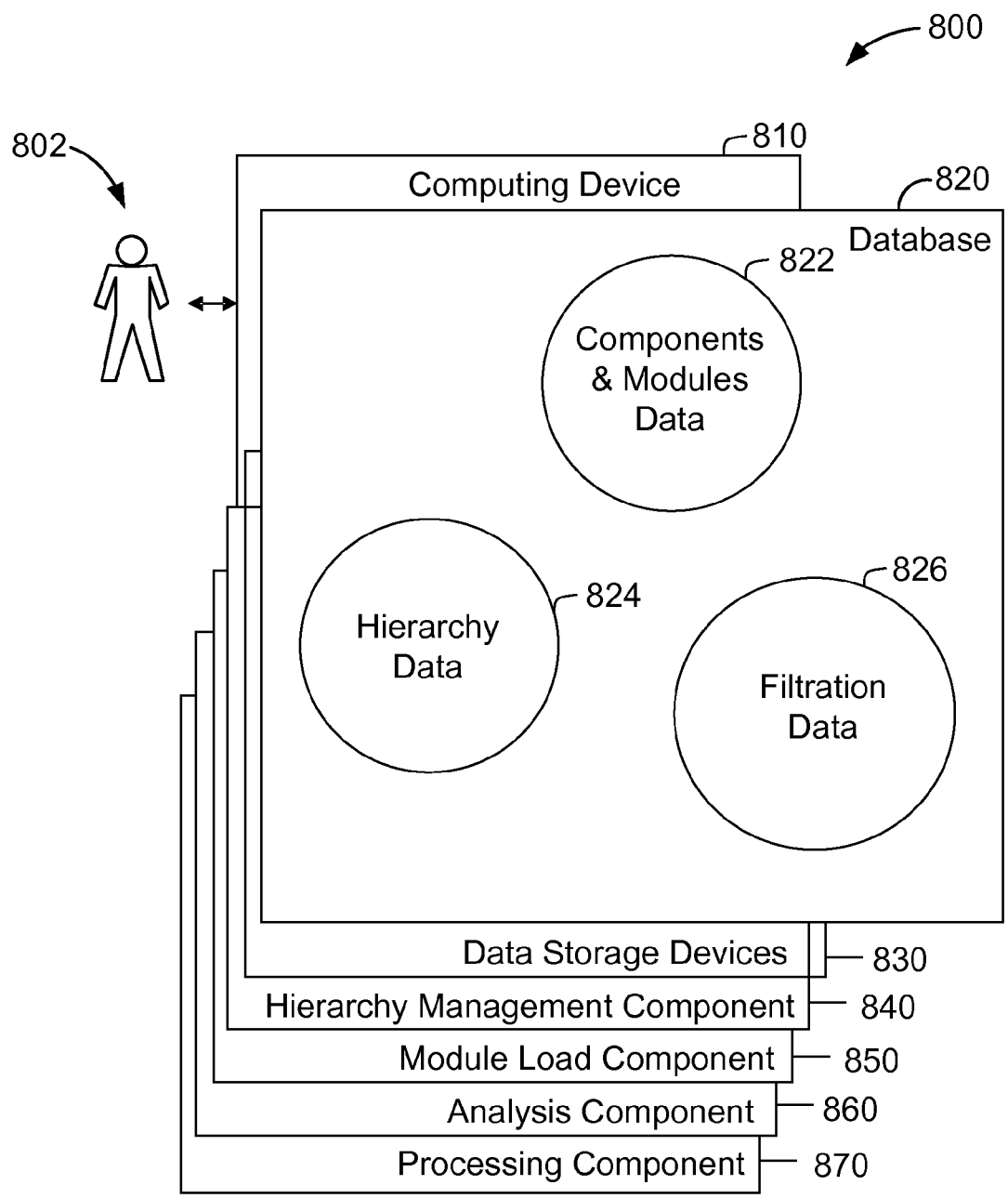

FIG. 8 shows an exemplary configuration 800 of a database 820 within a computing device 810, along with other related computing components, that may be used to manage component hierarchies that include filtering references. In some embodiments, computing device 810 is similar to hierarchy management system 720 (shown in FIG. 7). Database 820 is coupled to several separate components within computing device 810, which perform specific tasks.

In the exemplary embodiment, database 820 includes components & modules data 822, hierarchy data 824, and filtration data 826. In some embodiments, database 820 is similar to database 764 (shown in FIG. 7). Components & modules data 822 includes information associated with design components and modules as described above in reference to FIGS. 1-6. Hierarchy data 824 includes hierarchy component data and data defining relationships between components, such as shown in hierarchy 500 (shown in FIG. 5). Filtration data 826 includes data associated with component filtration, such as filtering reference 540 (shown in FIG. 5) and filter 550 (shown in FIG. 5).

Computing device 810 includes the database 820, as well as data storage devices 830. Computing device 810 includes a hierarchy management component 840 for importing modules, and building managing hierarchies such as hierarchy 500. Computing device 810 also includes a module load component 850 for processing modules associated with components of hierarchies. A filtration component 860 is also included for processing aspects of filtration processing as described in reference to process 700 (shown in FIG. 6). A processing component 870 assists with execution of computer-executable instructions associated with the tokenization system.

Figure 9:
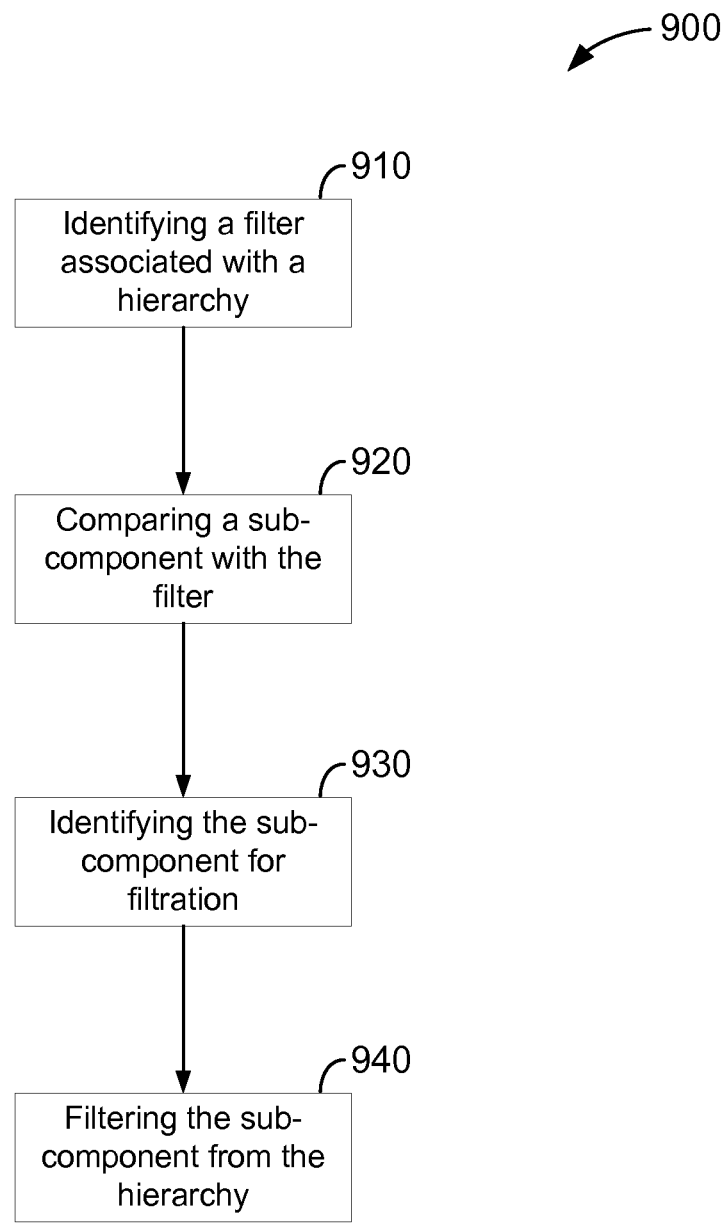

FIG. 9 is an example is an example method 900 for filtering components from a logical component hierarchy such as hierarchy 500 (shown in FIG. 5). In the example embodiment, method 900 is performed by a computing system such as hierarchy management system 720 (shown in FIG. 7) or computing device 810 (shown in FIG. 8). In the example embodiment, method 900 includes identifying 910, in the memory, a filter associated with the logical component hierarchy. In some embodiments, identifying 910 the filter further comprises identifying the filter including a scope criterion defining a set of components within the logical component hierarchy to which the filter is applied. In some embodiments, identifying 910 the filter further comprises identifying the filter wherein the scope criterion includes identification of an attachment node within the logical component hierarchy. In some embodiments, identifying 910 the filter further comprises identifying the filter wherein the set of components is defined to include nodes at or below the attachment node within the logical component hierarchy.

In the example embodiment, method 900 also includes comparing 920, by the processor, a sub-component of the logical component hierarchy with the filter. In some embodiments, identifying 910 a filter further comprises identifying the filter including an identification criterion defining one or more component features, and comparing 920 a sub-component further comprises comparing the identification criterion to features of the sub-component. In some embodiments, comparing the identification criterion further comprises comparing one or more of a component name, a component identifier, a component type, and a component version identifier to features of the sub-component. In some embodiments, comparing the identification criterion further comprises identifying filtration components based at least in part on a relational hierarchical name of the sub-component within the hierarchy.

In the example embodiment, method 900 also includes identifying 930 the sub-component for filtration based on the comparison of the sub-component with the filter. Method 900 also includes filtering 940 the sub-component from the logical component hierarchy.

As will be appreciated based on the foregoing specification, the above-described embodiments of the disclosure may be implemented using computer programming or engineering techniques including computer software, firmware, hardware or any combination or subset thereof, wherein the technical effect is a system for managing component hierarchies and implementing filtration and filtering references from hierarchies. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

The exemplary methods and systems facilitate excluding sub-components using filtering references defined within a component hierarchy. For example, a sub-component may be excluded during a hierarchy load by defining a filtration reference within an ancestor component that describes the component(s) to be excluded based on one or more of scope criteria and identification criteria. During hierarchy build, the systems and methods described herein exclude sub-components that match filtration references. As such, components are filtered or otherwise excluded from a component hierarchy.

At least one of the technical problems addressed by this system includes: (i) redundant hierarchical components appearing multiple times within a hierarchy; and (ii) conflicts caused due to the presence of different versions of a component within a hierarchy. Other technical problems addressed by the system and methods described herein may include increased computer processing due to unnecessary components appearing in the hierarchy, thus slowing down the computer.

The methods and systems described herein may be implemented using computer programming or engineering techniques including computer software, firmware, hardware, or any combination or subset thereof, wherein the technical effects may be achieved by performing at least one of the following steps: (a) identifying, in the memory, a filter associated with the logical component hierarchy; (b) comparing, by the processor, a sub-component of the logical component hierarchy with the filter; (c) identifying the sub-component for filtration based on the comparison of the sub-component with the filter; (d) filtering the sub-component from the logical component hierarchy; (e) identifying the filter including a scope criterion defining a set of components within the logical component hierarchy to which the filter is applied; (f) identifying the filter wherein the scope criterion includes identification of an attachment node within the logical component hierarchy; (g) identifying the filter wherein the set of components is defined to include nodes at or below the attachment node within the logical component hierarchy; (h) identifying the filter including an identification criterion defining one or more component features; (i) comparing the identification criterion to features of the sub-component; (j) comparing one or more of a component name, a component identifier, a component type, and a component version identifier to features of the sub-component; and (k) identifying filtration components based at least in part on a relational hierarchical name of the sub-component within the hierarchy.

The resulting technical effect achieved by this system is at least one of reducing computational requirements for maintaining a component hierarchy by, for example, enhancing segment reuse and/or component filtering. Thus, the system enables filtered component hierarchies, which results in a reduced amount of computational resources required to build and maintain the working hierarchy in memory, and thus a reduced burden on the computer.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-implemented method for filtering components from a logical component hierarchy, said method using a computing device having a processor and a memory, said method comprising:

storing, in the memory, the logical component hierarchy including a plurality of components and sub-components representative of a system to be assembled, wherein the logical component hierarchy includes a plurality of ancestor-descendant relationships between the plurality of components and sub-components;

identifying, in the memory, an exclusion filter associated with the logical component hierarchy, wherein the exclusion filter includes at least one of an ancestor and a descendant of the a sub-component to be removed;

comparing, by the processor, a sub-component of the logical component hierarchy and at least one of an ancestor and a descendant of the sub-component with the exclusion filter;

identifying the sub-component for exfiltration based on the comparison of the sub-component and at least one of an ancestor and a descendant of the sub-component with the exclusion filter;

filtering the sub-component out of the logical component hierarchy; and displaying at least part of the filtered logical component hierarchy.

2. The method of claim 1, wherein identifying an exclusion filter further includes identifying the exclusion filter including a scope criterion defining a set of components within the logical component hierarchy to which the exclusion filter is applied.

3. The method of claim 2, wherein identifying an exclusion filter further includes identifying the exclusion filter wherein the scope criterion includes identification of an attachment node within the logical component hierarchy.

4. The method of claim 3, wherein identifying an exclusion filter further includes identifying the exclusion filter wherein the set of components is defined to include nodes at or below the attachment node within the logical component hierarchy.

5. The method of claim 1, wherein identifying an exclusion filter further includes identifying the exclusion filter including an identification criterion defining one or more component features, and wherein comparing a sub-component further includes comparing the identification criterion to features of the sub-component.

6. The method of claim 5, wherein comparing the identification criterion further includes comparing one or more of a component name, a component identifier, a component type, and a component version identifier to features of the sub-component.

7. The method of claim 5, wherein comparing the identification criterion further includes identifying filtration components based at least in part on a relational hierarchical name of the sub-component within the hierarchy.

8. A computing device for filtering components from a logical component hierarchy, said computer device comprising a processor communicatively coupled to a memory, said memory including the logical component hierarchy, said computing device programmed to:

store, in the memory, the logical component hierarchy including a plurality of components and sub-components representative of a system to be assembled, wherein the logical component hierarchy includes a plurality of ancestor-descendant relationships between the plurality of components and sub-components;

identify, in the memory, an exclusion filter associated with the logical component hierarchy, wherein the exclusion filter includes at least one of an ancestor and a descendant of the a sub-component to be removed;

compare a sub-component of the logical component hierarchy and at least one of an ancestor and a descendant of the sub-component with the exclusion filter;

identify the sub-component for exfiltration based on the comparison of the sub-component and at least one of an ancestor and a descendant of the sub-component with the exclusion filter;

filter the sub-component out of the logical component hierarchy; and display at least part of the filtered logical component hierarchy.

9. The computing device of claim 8, wherein the exclusion filter includes a scope criterion defining a set of components within the logical component hierarchy to which the exclusion filter is applied.

10. The computing device of claim 9, wherein the scope criterion includes identification of an attachment node within the logical component hierarchy.

11. The computing device of claim 10, wherein the set of components is defined to include nodes at or below the attachment node within the logical component hierarchy.

12. The computing device of claim 8, wherein the exclusion filter includes an identification criterion defining one or more component features, and wherein comparing a sub-component further includes comparing the identification criterion to features of the sub-component.

13. The computing device of claim 12, wherein comparing the identification criterion further includes comparing one or more of a component name, a component identifier, a component type, and a component version identifier to features of the sub-component.

14. The computing device of claim 12, wherein comparing the identification criterion further includes identifying filtration components based at least in part on a relational hierarchical name of the sub-component within the hierarchy.

15. At least one non-transitory computer-readable storage media having computer-executable instructions embodied thereon, wherein when executed by at least one processor, the computer-executable instructions cause the processor to:

store, in a memory, the logical component hierarchy including a plurality of components and sub-components representative of a system to be assembled, wherein the logical component hierarchy includes a plurality of ancestor-descendant relationships between the plurality of components and sub-components;

identify an exclusion filter associated with a logical component hierarchy, wherein the exclusion filter includes at least one of an ancestor and a descendant of the a sub-component to be removed;

compare a sub-component of the logical component hierarchy and at least one of an ancestor and a descendant of the sub-component with the exclusion filter;

identify the sub-component for exfiltration based on the comparison of the sub-component and at least one of an ancestor and a descendant of the sub-component with the exclusion filter;

filter the sub-component out of the logical component hierarchy: and display at least part of the filtered logical component hierarchy.

16. The computer-readable storage media of claim 15, wherein the exclusion filter further includes a scope criterion defining a set of components within the logical component hierarchy to which the exclusion filter is applied.

17. The computer-readable storage media of claim 16, wherein the scope criterion further includes identification of an attachment node within the logical component hierarchy, wherein the set of components is defined to include nodes at or below the attachment node within the logical component hierarchy.

18. The computer-readable storage media of claim 15, wherein the exclusion filter includes an identification criterion defining one or more component features, wherein comparing a sub-component further includes comparing the identification criterion to features of the sub-component.

19. The computer-readable storage media of claim 18, wherein comparing the identification criterion further includes comparing one or more of a component name, a component identifier, a component type, and a component version identifier to features of the sub-component.

20. The computer-readable storage media of claim 18, wherein comparing the identification criterion further includes identifying filtration components based at least in part on a relational hierarchical name of the sub-component within the hierarchy.

* * * * *